United States Patent [19]

Montanari et al.

[11] Patent Number: 5,067,781
[45] Date of Patent: Nov. 26, 1991

[54] OPTICAL ELEMENTS AND METHOD OF MANUFACTURE

[75] Inventors: Dennis G. Montanari, Townsend; Richard L. Gentilman, Acton; Randal W. Tustison, Lexington, all of Mass.

[73] Assignee: Raytheon Company, Lexington, Mass.

[21] Appl. No.: 691,665

[22] Filed: Apr. 25, 1991

Related U.S. Application Data

[63] Continuation of Ser. No. 439,743, Nov. 21, 1989, abandoned.

[51] Int. Cl.$^5$ .............................. G02B 1/10; G02B 5/28
[52] U.S. Cl. ..................................... 359/350; 427/160; 427/162; 427/166; 428/908.8; 359/580; 359/507
[58] Field of Search ................. 350/1.6, 1.1, 165, 582, 350/438, 439, 1.7, 1.4, 413, 164, 165; 427/160, 162, 166; 428/908.8

[56] References Cited

U.S. PATENT DOCUMENTS

| | | | |
|---|---|---|---|
| 2,758,510 | 8/1956 | Auwarter | 350/1.6 X |
| 3,432,225 | 3/1969 | Rock | 350/166 X |
| 3,959,548 | 5/1976 | Bernal | 350/1.6 |
| 4,390,595 | 6/1983 | Yamagishi | 350/1.6 X |
| 4,461,750 | 7/1984 | Chess et al. | 423/263 |
| 4,476,156 | 10/1984 | Brinker et al. | 427/82 |
| 4,498,728 | 2/1985 | Thöni et al. | 350/1.7 |
| 4,867,544 | 9/1989 | Bornstein et al. | 350/1.4 X |
| 4,907,846 | 3/1990 | Tustison et al. | 350/1.6 |

FOREIGN PATENT DOCUMENTS

| | | | |
|---|---|---|---|
| 0049032A1 | 7/1982 | European Pat. Off. | |
| 292125 | 10/1953 | Switzerland | 350/164 |
| 2105371B | 10/1985 | United Kingdom | |
| 2165266A | 10/1985 | United Kingdom | |

OTHER PUBLICATIONS

Morimoto, Akiharu and Tatsuo Shimizu Synthesis and Characterization of Amorphous Si-Zn-S Alloy Films, accepted for publication 6/21/86, pp. 1275-1279.

Morimoto, Akiharu, Shinji Takamori, and Tatsuo Shimizu, New Type of Amorphous Alloy; Si-ZnS, Journal of Non-Crystalline Solids 77 & 78 (1985), pp. 965-968.

Sankur, Haluk, William J. Gunning, and Jeffrey F. DeNatale, Intrinsic Stress and Structural Properties of Mixed Composition Thin Films, Applied Optics, vol. 27, No. 8, 4/15/88, pp. 1564-1567.

Helmut Dislich et al., "Amorphous and Crystalline Dip Coatings Obtained from Organometallic Solutions: Procedures, Chemical Processes and Products", *Thin Solid Films*, 77(1981), pp. 129-139.

B. Frank et al., "Herstellung Und Eigenschaften Von Schichten Aus $Y_2O_3$ Und Oxiden Der Seltenen Erden Auf Glas", *Thin Solid Films*, 3(1969), pp. 41-50.

Bar & Stroud Spec. Sheet, No. ARZ5, "Advance Technical Data", (Date Unknown).

B. Hodgson et al., A Reprint from the Proceedings, "Diamond Turning of IR Components", SPIE, vol. 590, Infrared Technology and Applications (1985), pp. 71-76.

Table III, "Oxide Films for Optical Applications", Applied Optics, vol. 18, No. 12, Jun. 15, 1979, pp. 1972-1973.

(List continued on next page.)

*Primary Examiner*—Bruce Y. Arnold
*Assistant Examiner*—David R. Parsons
*Attorney, Agent, or Firm*—Denis G. Maloney; Richard M. Sharkansky

[57] ABSTRACT

An optical element resistant to thermally induced damage and oxidation includes a base layer of a first material selected from the group consisting of gallium arsenide, gallium phosphide, cadmium telluride, mercury cadmium telluride, zinc sulfide and zinc selenide, and a coating layer comprised of the selected base layer material and a refractory oxide. The coating layer has a first portion having a graded composition disposed adjacent the base layer. The coating also has a second portion disposed over the first portion with said second portion being the refractory oxide.

11 Claims, 3 Drawing Sheets

OTHER PUBLICATIONS

J. E. Field et al., Appendix, "Liquid Impact Damage Assessment or a Range of Infra-Red Materials", pp. 21-1 through 21-13.

S. Van Der Zwaag et al., "The Effect of Double Layer Coatings of High Modulus on Contact Stresses", Philosophical Magazine A, 1986, vol. 53, No. 1, pp. 101-111.

"Plasma Assisted Ion Plating Deposition of Optical Thin Films for Coatings and Integrated Optical Applications", M. Varasi, C. Mancini, P. Sartori, C. Misiano, Vacuum vol. 36, No. 1-3, pp. 143-147, 1986.

"Compressive Thin Films for Increased Fracture Toughness", P. H. Kobrin and A. B. Harker, Rockwell International Science Center, pp. 5-9.

"Impact Damage Thresholds in Brittle Materials Impacted by Water Drops", A. G. Evans, V. M. Ito, and M. Rosenblatt, J. Appl. Phys. 51(5), May 1980, pp. 2473-2482.

"Antisolar and Thermally Insulating Thin Films for Simple Glazings", D. Gross, Elsevier Sequoia, Sep. 18-20, 1980, Thin Solid Films 77 (1981) 128.

"Oxide Coatings from the Sol-Gel Process", Lisa C. Klein, Ceramic Engineering & Science Proceedings, vol. 5, No. 5-6, May-Jun. 1984, pp. 378-385.

"Liquid Jet Impact Damage on Zinc Sulphide", S. Van Der Zwag, J. E. Field, Journal of Material Science, vol. 17 (1982), pp. 2525-2636.

"Growth of Diamond at Room Temperature by an Ion-Beam Sputter Deposition Under Hydrogen-Ion Bombardment", Makoto Kitabatake and Kiyotaka Wasa, J. Appl. Phys. 58(4), Aug. 15, 1985, pp. 1693-1695.

"Structure and Properties of Quasi-Amorphous Films Prepared by Ion Beam Techniques", C. Weissmentel, K. Bewiloqua, D. Dietrich, H.-J. Erler, H.-J. Hinneberg, S. Klose, W. Nowick, and G. Reisse, Thin Solid Films, vol. 72 (1980), 19-31.

S. Van der Zwaag and F. E. Field, "Liquid Impact Erosion Mechanisms in Transparent Materials", Materials Laboratory (AFWAL/MLBE), Wright-Patterson AFB, Report No. AFWAL-TR-82-4022, Mar. 1988.

J. E. Field, S. Van der Zwagg, D. Townsend and J. P. Dear, "Liquid Impact Erosion Mechanisms in Transparent Materials", Materials Laboratory (AFWAL/MLBE), Wright-Patterson AFB, Report No. AFWAL-TR-83-4101, Oct. 1983.

"Guide to IR-Transmissive Materials", F. Lussier, Laser Focus, vol. 12, No. 12, Dec. 1976, pp. 47-50.

OPTICAL ELEMENTS AND METHOD OF MANUFACTURE

This application is a continuation of U.S. Pat. application Ser. No. 439,743 filed Nov. 21, 1989.

BACKGROUND OF THE INVENTION

This invention relates generally to optical elements and more particularly to coatings which protect and strengthen IR optical elements.

As is known in the art, optical imaging systems generally include an optical element which shields the remainder of the imaging system from a hostile environment. For example, with infrared (IR) airborne imaging systems, an IR transparent optical element, such as window or dome, is mounted on the airborne system to isolate the remainder of the IR imaging system from exposure to humid, corrosive, abrasive, and high temperature environments. Prolonged exposure to these environments generally degrade the optical and physical characteristics of the material of the optical element. For many applications involving low speed missiles, low velocity water droplet impact is generally the most severe environmental exposure. However for newer hypersonic missile applications, the thermal heating of the optical element is the most severe environmental exposure. With missiles travelling at hypersonic velocities (e.g. MACH 1+ to MACH 4 or higher) the optical element heats up very quickly, and optical elements comprised of materials with low thermal shock resistance are particularly susceptible to thermally induced damage.

A second application of such elements is as an observation window in a furnace to monitor a combustion process. Again, these elements shield an IR system from a high temperature environment.

Typically, materials which offer the best mechanical durability and optical performance for infrared imaging systems, particularly in the 8 $\mu$m to 12 $\mu$m infrared band, are limited to a relatively small number. Suitable materials include zinc sulfide, zinc selenide, germanium, gallium arsenide, gallium phosphide, mercury cadmium telluride and cadmium telluride. Ternary sulfide materials such as calcium lanthanum sulfide are also currently being developed for IR applications, particularly in the 8-12 $\mu$m band. These ternary sulfide materials may provide some improvement in durability but even these materials are susceptible to the environmental exposures mentioned above. Generally, all of the aforementioned materials are relatively brittle, have low thermal shock resistance, and have a relatively low resistance to damage, particularly damage sustained during high velocity water droplet impact.

Moreover, these materials also have relative high susceptibility to forming oxides while exposed to high temperature environments containing oxygen as would be encountered in the flight of a hypersonic missile, or as an observation window in a furnace. These oxides generally reduce significantly the IR transmittance of the optical element, increase IR scatter and in general degrade optical characteristics. In particular, many of the materials form oxides which have significant absorption bands in the 8-12 micron range.

It is also known in the art that optical energy incident upon a surface of an optical element will result in reflection of energy at such surface if the index of refraction of the material comprising the optical element is significantly different than the index of refraction of the medium from which the energy originates. Generally, for airborne systems, the originating medium is air having an index of refraction of about 1.0. Accordingly, it is standard practice in the optical industry to provide coatings of material of appropriate refractive index over the incident surface of the optical element to reduce such reflection losses. At the deposited thicknesses, which are generally related to a fraction of an optical wavelength, these coatings are transparent in the IR band. However, heretofore such optical coatings have served only to reduce reflection losses caused by a mismatch in refractive indices. Such optical coatings have not increased the thermal shock resistance of the optical element nor have such coatings reduced or eliminated the aforementioned problems of oxidation of the material of such optical elements.

Thus, for the above-mentioned applications, a suitable coating to protect such elements should increase the thermal shock resistance of the material, while reducing thermally induced oxidation of the material. Such a coating should also provide proper anti-reflection correction and maintain high IR transmittance.

Moreover, in applications where rapid thermal cycling is encountered, the coating would need to have coefficient of thermal expansion characteristics which are substantially the same as that of the base material. This would retard debonding of the coating from the base during exposure to high temperature environments.

SUMMARY OF THE INVENTION

In accordance with the present invention, an optical element includes a base layer of a first material selected from the group consisting of gallium arsenide, gallium phosphide, cadmium telluride, mercury cadmium telluride, zinc sulfide and zinc selenide, and a coating layer comprised of the selected base layer material and a refractory oxide. The coating layer has a first portion having a graded composition disposed adjacent the base layer. The first portion has a composition initially of the material of the base layer. The composition of the first portion gradually increases in the proportion of the refractory oxide with increasing thickness of said first portion. Concomitantly, the first portion has a composition which correspondingly decreases in the proportion of the base material with increasing thickness of the first portion of the coating. The coating also has a second portion disposed over the first portion with said second portion being the refractory oxide. With such an arrangement, the graded first portion of the coating layer bonds well to the base material of the optical element and will have a high degree of resistance to debonding caused by sudden exposure of the element to a high temperature environment. Moreover, the refractory oxide second layer will bond well to the graded first portion and will protect the base material from oxidation during exposure to high temperature, oxidizing environments. Moreover, if the coating has a higher modulus of elasticity than that of the material of the base, the coating will also protect the base from impact damage, particularly such impact damage caused by high velocity droplet impact. Furthermore, the coating material having a high resistance to debonding from sheering forces will remain intact on the optical element during high velocity water droplet impact, as well as during thermal cycling, and thereby protect the optical element from detrimental environmental exposures.

In accordance with a further aspect of the present invention, the refractory oxide material of the coating layer is selected from the group consisting of yttrium oxide, scandium oxide, magnesium oxide, cerium oxide, titanium oxide, and zirconium oxide, and mixtures thereof. With such an arrangement, an impact resistant anti-reflection coating for optical elements is provided. With the coating, such elements are more resistant to damage caused by exposure to high temperature oxidizing environments, as well as rain erosion or high velocity water droplet impact environments. Moreover, the refractory oxide material in the coating layer may be selected based upon the index of refraction of the refractory oxide in relation to that of the material of the base to anti-reflect correct the optical element and thus reduce surface reflection losses while also serving to protect the optical element.

In accordance with a still further aspect of the present invention, an optical element transparent over at least the 8 μm to 12 μm wavelength band includes a base layer, with the material of the base layer selected from the group consisting of zinc sulfide and zinc selenide, and a coating layer, with the material of the coating including the selected one of zinc sulfide, and zinc selenide, and a refractory oxide selected from the group consisting of yttrium oxide, scandium oxide, and magnesium oxide and mixtures thereof. The coating layer has the graded composition portion disposed over the base and the second portion of the selected refractory oxide. With such an arrangement, an optical element having a high degree of transparency over the 8–12 μm range, as well as a high degree of resistance to oxidation and thermal shock damage, as well as droplet impact damage, is provided.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENT

Figure 1:
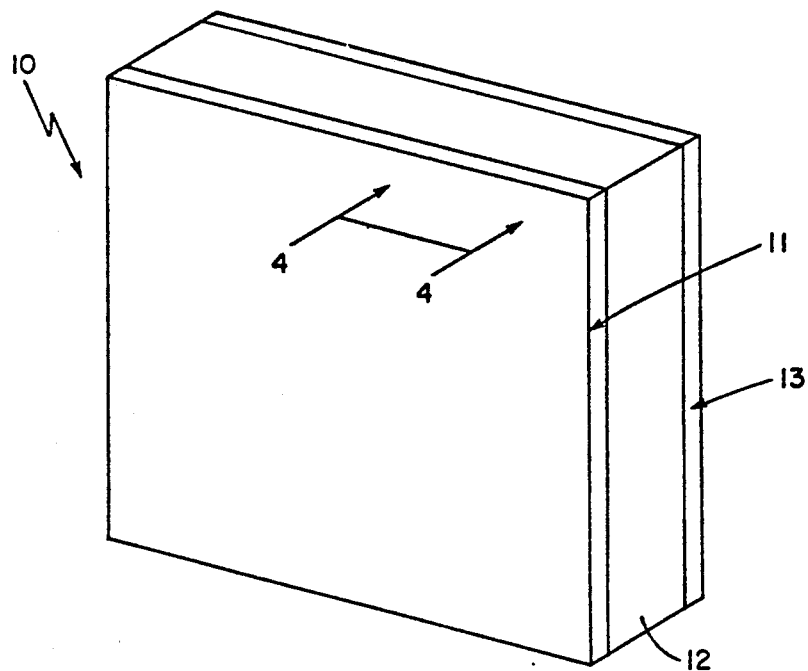
FIG. 1 is an isometric view of an optical element, here a plate comprising a base layer and a protective coating in accordance with the present invention.

Referring now to FIG. 1, an optical element here a plate 10 is shown to include a base layer 12 comprising a material having predetermined optical properties. Although the optical element is herein described in particular as being a plate, it is understood that other types of optical elements such as windows, domes, lenses, etc. having shapes other than planar may alternatively be substituted for the aforementioned plate 10. Typically base layer 12 will have a thickness of at least 0.05 in. generally 0.1 in. to about 0.5 in. or thicker. The optical element further may have selective optical properties. For example, the optical element may be comprised of a material which is transparent to optical energy generally in the infrared, visible, and/or ultraviolet spectrums. The material may be a dielectric or a semiconductor material.

In particular, for optical elements used in infrared imaging systems in the 8 μm to 12 μm wavelength range, examples of preferred materials include gallium arsenide, gallium phosphide, mercury cadmium telluride, cadmium telluride, zinc sulfide, zinc selenide, or one of the ternary sulfides. The selected material comprising layer 12 may be fabricated by any known technique such as powder compaction and densification or chemical vapor deposition. In particular for infrared applications, the material selected for layer 12 is generally characterized as having a relatively low modulus of elasticity typically in the range of $5 \times 10^6$ psi to $15 \times 10^6$ psi, a high transmittance to infrared energy, typically in a range of 50% to 75% over at least a portion of the infrared wavelength band of 2.0 μm to 30 μm, and an index of refraction at 10 microns typically in the range of 2.2 to 4.0. The relevant mechanical and optical properties of some of these materials are shown in Table 1.

TABLE 1

| | Properties of Materials for Base Layer 12 | | | |
|---|---|---|---|---|
| Material | n @ 10 μm | R% | Thermal Expansion Coefficient ($10^{-6}$/°C.) | Elasticity Modulus of × ($10^6$ psi) |
| CdTe | 2.6 | 0.01 | 5.9 | 5.0 |
| ZnSe | 2.4 | 0.25 | 7.7 | 9.7 |
| ZnS | 2.2 | 0.89 | 7.4 | 10.8 |
| CaLa$_2$S$_4$ | 2.4 | 0.25 | 14.7 | 13.8 |
| GaP | 3.0 | 0.37 | 5.3 | 20.6 |
| GaAs | 3.3 | 1.17 | 5.7 | 15.5 |

R% is the reflection loss per surface resulting from a single quarter optical wavelength AR coating of $Y_2O_3$ as will be described below, applied over the corresponding material.

Disposed over base 12 are here a pair of protective coating layers 11, 13 which provide a relatively high degree of protection to such element from high temperature, oxidizing and impact erosion environments. It is to be understood that while the optical element 10 is shown with two layers 11, 13 over major surfaces of the base 12, for some applications only one layer would be necessary, whereas for other applications all surfaces may be coated with the protective layer coatings.

Figure 2:
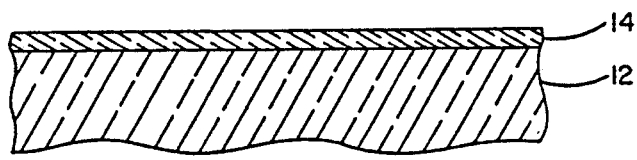
FIGS. 2 and 3 are exploded cross-sectional views showing steps in providing the protective coating in accordance with the present invention.
Figure 3:
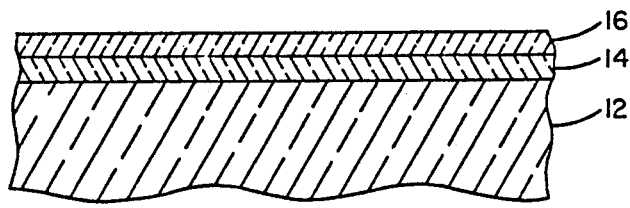
Figure 4:
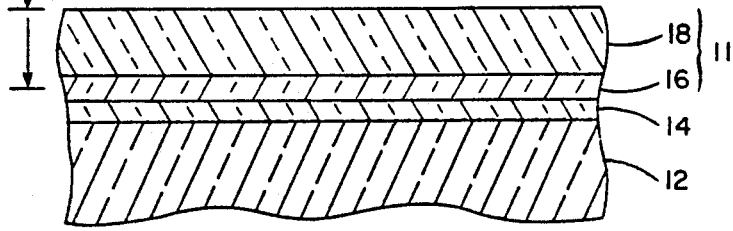
FIG. 4 is an exploded cross-sectional view taken along line 4—4 of FIG. 1 showing the protective coating in accordance with the present invention.

Referring now to FIGS. 2–4, steps in the fabrication of the optical element 10 will be described with respect to layer 11a, it being understood that layer 11b would be provided by a similar approach.

Referring now to FIG. 2, a first preparatory layer 14 is disposed over and preferably on the material comprising base 12. Preparatory layer 14 is preferably comprised of the same material as the material of the base 12 and is deposited to a suitable thickness of about 100Å to 500Å or thicker to provide a suitable surface for deposition of the coating layer 11 (FIG. 1). Preferrable, the thickness of layer 14 is 1000Å and higher to provide a continuous layer free of voids. Since the material of layer 14 is the same as that of base 12, layer 14 has an index of refraction and thermal expansion coefficients which are substantially equal to that of the material of base layer 12. In particular, the material of layer 14 will have a high degree of adherence to the material of base 12. Layer 14 may be deposited by any technique such as ion beam sputtering, diode sputtering, or evaporation, or as will be described, r.f. magnetron sputtering. Other techniques may alternatively be used to provide layer 14 over the base 12.

Referring now to FIG. 3, a graded composition layer 16, a mixture of the material of the preparatory layer 14 (alternatively the material of the base layer 12) and a refractory oxide is shown. Layer 16 has a composition profile in which the proportion of the material of the preparatory layer 14 (or base layer 12) gradually decreases as a function of increasing thickness of the graded composition layer 16. That is, the layer 16 has a composition, which is proportionally rich in the material of layer 14 in that portion of layer 16 adjacent to layer 14. This proportion of the material of layer 14 gradually decreases as a function of the increasing thickness of layer 16 while the proportion of the refractory oxide in layer 16 gradually increases with increasing thickness until the composition of layer 16 is substantially 100% of the refractory oxide at the maximum thickness of layer 16. In general, layer 16 is relatively thin, approximately 500 Å to 3000 Å particularly where the base material and refractory oxide have similar coefficients of thermal expansion.

For the aforementioned base layer 12 materials, suitable refractory oxide materials include yttrium oxide ($Y_2O_3$), magnesium oxide (MgO), scandium oxide ($Sc_2O_3$) cerium oxide ($CeO_2$), titanium oxide ($TiO_2$), and zirconium oxide ($ZrO_2$), as well as, homogeneous mixtures of the aforementioned materials. The relevant mechanical and optical properties for these materials are shown in Table 2.

TABLE 2

| Properties Of Materials For Layer 14 | | | | |
|---|---|---|---|---|
| Material | @ (10μ) | Transmissivity range of 1.5 μm thick | Thermal Expansion Coefficient $10^{-6}/°C$ | ($10^6$ psi) Modulus of Elasticity | $H_2O$ Solubility |
| $Y_2O_3$ | 1.63 | 0.3–12μ | 7.2 | 25 | insol. |
| $Sc_2O_3$ | 1.70 | 0.3–12μ | 8.5 | 26 | insol. |
| MgO | 1.70 | 0.3–12μ | 12.0 | 48 | insol.-reacts with $H_2O$ |
| $CeO_2$ | 2.34 | | 11.3 | 22 | insol. |
| $TiO_2$ | 2.4 | | 8.2 | 44 | insol. |
| $ZrO_2$ | 2.1 | | 7.2 | 28 | insol. |

The principal optical characteristic to be considered in selecting the refractory oxide for coating 11 is that the selected material should have an index of refraction suitable to provide antireflection correction to the base material of the optical element 10.

In order to provide anti-reflection correction, the index of refraction of the refractory oxide material included in graded layer 16 is preferably less than the index of refraction of the material of base 12. In general for anti-reflection correction, for example between air having an index of about 1.00 and the material of base layer 12, the index of refraction required of the coating 11 ($n_{11}$) is approximately equal to the geometric mean of the indices of refraction of the material of base layer 12 and the surrounding medium ($n_{14} \approx n_{12}$). As is known in general for most materials, the index of refraction varies as a function of wavelength dispersion. Accordingly, this anti-reflection correction also varies as a function of wavelength.

Referring now to FIG. 4, a layer 18 is shown deposited over the graded layer 16. Layer 18 is the selected one of the refractory oxides. Layer 18 in combination with layer 16 has a physical thickness, corresponding to an effective optical thickness of one-quarter of an optical wavelength at the particular wavelength of interest for the optical element.

In general, the optical thickness ($t_o$) of such elements is defined as the product of the physical thickness (t) of the coating 11 and the refractive index ($n_c$) of the material of the coating 11 ($t_o = t \cdot n_c$) The desired physical thickness for an optical thickness of λ/4 is generally given by $t = (\lambda/4)/nc$ where is the wavelength of particular interest for the optical element and $n_c$ is the refractive index of the coating at the wavelength of interest.

Here, since a portion 16 of the coating 11 has a graded composition of a relatively low index material (layer 18) and a relatively higher index material (layer 12) the effective optical wavelength will include about one-half of the thickness of the graded layer 16. As will now be appreciated by those skilled in the art, the optical thickness ($t_o$) may be a higher order thickness such as 3 λ/4 or 5 λ/4, and the physical thickness t is then generally given by $t = ((2N+1) \lambda/4)/n_c$, where N is an integer 0,1,2,3 .... For subsequent λ/4 layers the physical thickness $t_p$ of these layers would correspond to in $\lambda t_p = (t_o \cdot n_c)$. Thus, the physical thickness $t_p$ of layer 18 may be increased, offering greater protection for base 12 while still maintaining good antireflection and transmittance properties.

Figure 5:
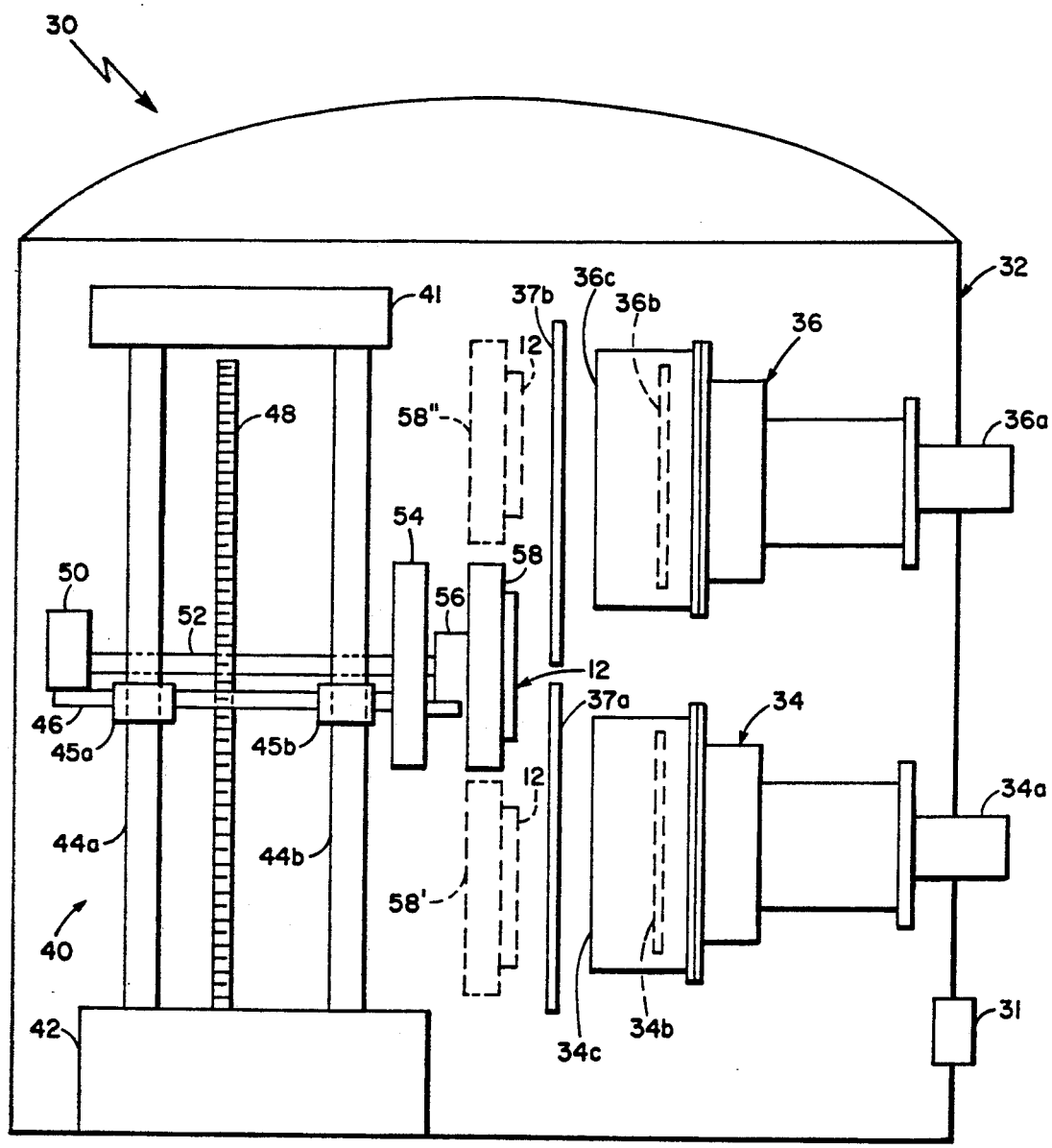
FIG. 5 is a schematic representation of a preferred deposition apparatus used to provide the coating layer over the element of FIG. 1.

Referring now to FIG. 5, an apparatus 30 for providing preparatory layer 14 and layers 16 and 18 of the coating 11 is shown to include a vessel 32, here a vacuum vessel 32, which may support a vacuum pressure of at least $10^{-5}$ torr typically comprised of stainless steel and a pair of r.f. magnetron sputtering guns 34 and 36, as shown. The r.f. magnetron sputter guns, are here 3" Magnetron Sputtering Guns from U.S. Gun Inc., Campbell, CA. The guns 34, 36 are identical, and each has an inlet 34a, 36a, through which are fed cooling water and power (not shown) and an outlet 34c, 36c, from which during operation are provided sputtered species from a target 34b, 36b mounted within the r.f. magnetron sputtering guns 34, 36, respectively. Here target 34b is the base material of substrate 12, whereas target 36b, which is disposed in magnetron sputtering gun 36 is here the selected one of the refractory oxides as mentioned above. The apparatus 30 is shown to further include a pair of shutters 37a, 37b disposed in front of the exit ports 34c, 36c, respectively of the magnetron sputtering guns 34, 36. Such shutters 37a, 37b are in a normally closed position except during deposition of material onto substrate 12. The apparatus further includes a substrate elevation and rotation apparatus 40, including a base 42 having disposed therein a motor and drive train (not shown) used to rotate a right-hand screw-threaded shaft 48. The apparatus 40 further includes here three supports 44a, 44b, (one not shown) which are mounted between the base 42 and a cap 41, and which in combination with the base 42 provides rigid structural integrity to the apparatus 40. The apparatus 40 further includes a table or platform 46 having guides 45a, 45b mounted therethrough. The supports are disposed through the guides 45a, 45b, and such guides are used to guide the platform along the supports 44a, 44b. The table 46 also has a threaded aperture (not numbered) through which threaded shaft 48 is threadably engaged. Thus when thread shaft 48 rotates clockwise, for example, the platform moves in an upward position, whereas when shaft 48 rotates counterclockwise, the platform moves in a downward position, each position being relative to the base 42.

Disposed on platform 46 is a second motor 50 having a second shaft 52, which is disposed through a conventional hotplate heater 54 and a coupling 56. Coupling 56 is mounted to the rear of a substrate holder 58 and permits substrate holder 58 to rotate clockwise or counterclockwise in accordance with the rotation of shaft 52.

Thus, apparatus 40 permits the substrate 12 to be rotated clockwise or counterclockwise in accordance with the rotation of motor 50 and to move longitudinally up and down in accordance with the rotation of shaft 48. The vessel 32 further includes a port 31 through said vessel 32, as shown, used to evalcuate the vessel and to backfill the vessel with an inert gas, such as argon, which is used during the sputtering operation, as will now be described.

In order to provide layers 14, 16, and 18 over the substrate 12, here with said substrate 12 being, for example zinc sulfide, layer 14 would also be zinc sulfide, layer 16 would be a combination of zinc sulfide and a selected one of said refractory oxides. Preferred examples for the refractory oxides when base 12 is zinc sulfide or zinc selenide, would include yttrium oxide, scandium oxide, and magnesium oxide. Here, yttrium oxide is the refractory oxide in layer 16 and layer 18. Thus, the target 34b in the r.f. magnetron sputter 34 is zinc sulfide, whereas the target 36b in r.f. magnetron sputterer 36 is yttrium oxide. To start a deposition the interior of vessel 32 is first evacuated to a vacuum of about $1 \times 10^{-5}$ torr up to $10^{-7}$ torr. Then the vessel 32 is backfilled with Ar to a pressure of about 1 to 200 mtorr. Argon is here used to bombard targets 34b, 36b sputtering off ZnS and $Y_2O_3$, respectively. The substrate heater 54 is activated to raise the temperature of substrate 12 to a predetermined temperature generally above the boiling point of water, or 100° C. to drive water from the substrate 12. The motor 50 is activated to enable the substrate 12 to rotate, in here a clockwise direction, whereas the shaft 48 is rotated so that the platform 46, and thus the substrate holder 58 is in its initial position 58', (denoted in phantom), generally opposite the exit port 34c of the first r.f. magnetron sputtering source 34. R.F. magnetron sputtering sources 34 and 36 are energized and coolant water (not shown) is directed through the sources 34, 36 via outlets 34a, 36a. The shutters 37a, 37b are in their normally closed position and zinc sulfide and yttrium oxide are permitted to deposit on the shutters 37a, 37b. After a predetermined period of time to getter impurities which may be contained in the vessel 32, shutter 37a is opened thereby permitting zinc sulfide to deposit from the r.f. magnetron sputterer onto substrate, 12, while the substrate 12 is held in its initial position 58'. This provides the preparatory layer 14. Here preparatory layer 14 is deposited to a thickness of typically 1500 Å. After a predetermined period of time sufficient to provide the desired thickness for layer 14, shutter 37b is also opened permitting yttrium oxide to be displaced towards the substrate 12. Since substrate 12 is still opposite source 34, very little $Y_2O_3$ is incorporated into layer 16. The substrate platform 46 is gradually elevated to an intermediate position denoted by the position 58 and during such period of time, yttrium oxide and zinc sulfide are deposited to provide the graded composition layer 16. From this point, the proportion of zinc sulfide in layer 16 will be decreasing with increasing thickness of layer 16 and concomitantly that of yttrium oxide will be increasing with increasing thickness of layer 16. The substrate 12 is held at an intermediate position for a predetermined period of time and then the platform 46 is again raised towards the final position 58" (denoted in phantom) of substrate holder 58. When the substrate holder 58 reaches its final position, the shutter 37a is closed and a final deposit of yttrium oxide is provided over the graded layer 16. This final layer 18 of yttrium oxide is deposited to a final thickness, such that layer 18 and an optically effective portion of layer 16 provides a coating 11 having a physical thickness corresponding to one-quarter of an optical wavelength.

Preferred deposition parameters for depositing layers 14, 16 and 18 are set forth below:

| Temperature Range of Heater 5B | 100° C. Min. |
|---|---|
| Flow Rate of Ar | 5 SCCM to 100 SCCM |
| Deposition Rate of $Y_2O_3$ (typ) | 5.0 Å/S |
| Deposition Rate of ZnS (typ) | 5.0 Å/S |

| Time Profile For Layer 16 | | |
|---|---|---|
| Time | Position of Substrate | Deposition |
| Example 1 | | |
| 5 min | Initial Position (58') | ZnS |
| 2.0 min | Intermediate Position (58) | ZnS, $Y_2O_3$ |
| 2.0 min | Final Position (58") | ZnS, $Y_2O_3$ |
| 45 min | Final Position (58") | $Y_2O_3$ |
| Example 2 | | |
| 5 min | Initial Position (58') | ZnS |
| 2 min | Initial Position (58') | ZnS, $Y_2O_3$ |
| 2.5 min | Initial to Final Position (58) | ZnS, $Y_2O_3$ |
| 2 min | Final Position (58") | ZnS, $Y_2O_3$ |
| 45 min | Final Position (58") | $Y_2O_3$ |

Figure 6:
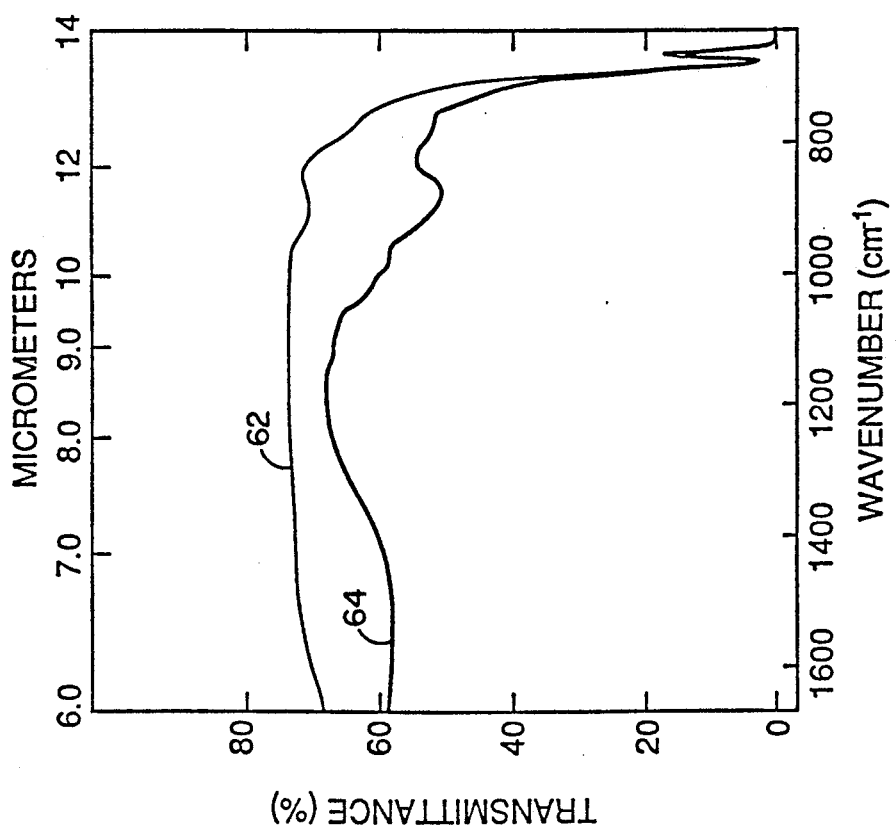
FIG. 6 is a graph of % transmittance vs. wavelength (microns) and wavenumber ($cm^{-1}$) for an uncoated sample of zinc sulfide, with one plot being prior to exposure of the uncoated sample and the other plot being subsequent to exposure of the uncoated sample to a high temperature oxidizing environment.

Referring now to FIG. 6, percent (%) transmittance data of an uncoated zinc sulfide plate prior to and subsequent to exposure to a high temperature oxidizing environment is shown. The transmittance curve 62 is that of an uncoated sample of standard grade zinc sulfide obtained from Raytheon Company, Research Division, Lexington, Mass. prior to exposure of the sample to a high temperature oxidizing environment. Curve 64 denotes the transmittance of that sample after exposure to the high temperature, oxidizing environment in which the sample was rapidly exposed to the oxidizing environment of a furnace preheated to a temperature of 1000° C. For curve 64, the exposure period was approximately two minutes and the estimated temperature which the sample achieved was 880° C.

Figure 7:
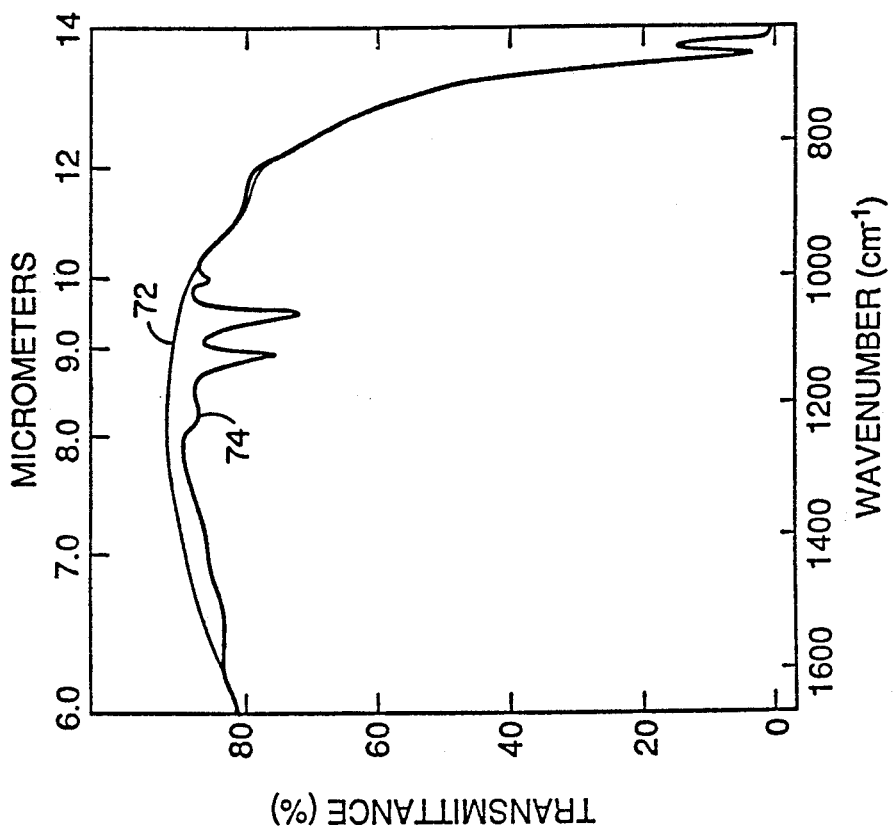
FIG. 7 is a graph of % transmittance vs. wavelength (microns) and wavenumber ($cm^{-1}$) for a sample of zinc sulfide coated on both major surfaces in accordance with the present invention, with one plot being prior to exposure of the coated sample and the other plot being subsequent to exposure of the coated sample to a high temperature oxidizing environment.

Referring now to FIG. 7, a second sample of the same zinc sulfide material was prepared with a preparatory layer 14 of zinc sulfide and provided with a coating 11 as described above in conjunction with FIGS. 1–4. The coating included a graded region 16 of zinc sulfide and yttrium oxide and a have an approximately λ/4 optical thickness. The sample was coated on both major surfaces. The % transmittance of the sample prior to exposure to the high temperature, oxidizing environment is shown in FIG. 7, as curve 72, whereas the sample subsequent to exposure to the oxidizing environment of a furnace at 1000° C. is shown in FIG. 7 as curve 74.

The uncoated zinc sulfide sample, after being exposed for two minutes to the high temperature oxidation environment lost an average of 12.8% transmissivity over the 8-12 micron band. The zinc sulfide sample coated on both surfaces, in accordance with the present invention, lost an average of only 3.2% over the 8-12 micron band. Curve 74 of FIG. 7 depicts several absorption bands around 9 microns. It is believed that with further refinements of the process or possible use of the alternative refractory oxides that these absorption bands can be reduced or eliminated. Nevertheless, the presence of these relatively minimal absorption bands should not affect the use of such optical elements in many applications where thermal resistance and oxidation resistance are necessary.

It is to be noted that the graded portion 16 of coating 11 provides a tight bond between layer 18 and the base 12 thus retarding debonding of layer 18 during rapid thermal cycling and droplet impact. Oxidation of the optical element material is reduced by providing a refractory oxide as the material of layer 18.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. An optical element, comprising:
    a base comprising a first material having a first predetermined optical transmittance over at least a portion of the optical range of about 2 microns to 30 microns; and
    a coating layer disposed over said base comprising a refractory oxide, said coating layer having a first region comprising the material of said base layer and said refractory oxide, and a second region of said refractory oxide disposed over said first region with the first region of the coating layer having a graded composition, with the proportion of the material of the base declining as a function of increasing thickness of the first region, while the proportion of the refractory oxide in the first region increases as a function of increasing thickness of the first region.

2. The optical element, as recited in claim 1, wherein the material of the base is selected form the group consisting of zinc sulfide, zinc selenide, gallium arsenide, gallium phosphide, mercury cadmium, cadmium tellurium, and a ternary sulfide, having the general chemical formula $MN_2S_4$, where M is a cation selected from the Group 1A elements, N is a cation selected from the lanthanide rare earths series elements and S is the sulfide anion $S^{2-}$.

3. The optical element, as recited in claim 1, wherein the refractory oxide is selected from the group consisting of yttrium oxide, scandium oxide, magnesium oxide, cerium oxide, titanium oxide, zirconium oxide, and mixtures thereof.

4. The optical element, as recited in claim 1, wherein the coating has an optical thickness equal to a quarter of a wavelength.

5. An optical element, comprising:
    a base comprising a material selected from the group consisting of zinc sulfide and zinc selenide having a first predetermined optical transmissivity over at least the optical range of about 8 microns to 12 microns; and
    a coating layer disposed over said base comprising:
    a first region comprising the material of said base layer and a refractory oxide selected from the group consisting of yttrium oxide, scandium oxide, magnesium oxide, and mixtures thereof; with the first region of the coating layer having a graded composition and with the proportion of the selected material of the base declining as a function of increasing thickness of the first region, while the proportion of the selected refractory oxide in the first region increases as a function of increasing thickness of the first region; and
    a second region of said refractory oxide disposed over said first region of said coating layer.

6. The optical element, as recited in claim 5 where the selected base material is zinc sulfide and the selected refractory oxide is yttrium oxide.

7. The optical element, as recited in claim 6, wherein the coating has an effective optical thickness equal to a quarter of a wavelength.

8. A method of providing an optical element comprises the steps of:
    providing a base of a first material having a first predetermined optical transmissivity over at least a portion of the range of 2 microns to 30 microns;
    depositing a graded layer comprising the material of the base and a refractory oxide; and
    providing a second layer of said refractory oxide over the graded layer.

9. The method of claim 8, wherein the depositing step includes the steps of:
    sputtering the material of the base over the base while sputtering the refractory oxide over the base to provide a graded layer intermixed with the material of the base and the refractory oxide.

10. The method of claim 9, wherein the step for providing a second layer comprises the step of:
    sputtering the refractory oxide over the graded layer.

11. The method of claim 10, wherein each sputtering step is an r.f. magnetron sputtering step.

* * * * *